US011942266B1

(12) United States Patent
Thies et al.

(10) Patent No.: US 11,942,266 B1
(45) Date of Patent: Mar. 26, 2024

(54) ELECTRICAL POWER DISTRIBUTION AND MONITORING SYSTEM FOR DATA

(71) Applicant: Uber Technologies, Inc., San Francisco, CA (US)

(72) Inventors: Paul Christopher Thies, Mountain View, CA (US); Tor Adom Kyaagba, San Francisco, CA (US)

(73) Assignee: UBER TECHNOLOGIES, INC., San Francisco, CA (US)

( * ) Notice: Subject to any disclaimer, the term of this patent is extended or adjusted under 35 U.S.C. 154(b) by 30 days.

(21) Appl. No.: 17/692,734

(22) Filed: Mar. 11, 2022

(51) Int. Cl.
*H01F 38/30* (2006.01)

(52) U.S. Cl.
CPC .................... *H01F 38/30* (2013.01)

(58) Field of Classification Search
CPC ........................................ H01F 38/30
See application file for complete search history.

(56) References Cited

U.S. PATENT DOCUMENTS

| | | | |
|---|---|---|---|
| 7,289,334 B2 | 10/2007 | Behrens et al. | |
| 7,358,439 B2 | 4/2008 | Rasmussen et al. | |
| 8,173,898 B2 | 5/2012 | Rasmussen et al. | |
| 9,232,678 B2 | 1/2016 | Bailey et al. | |
| 9,545,029 B2 | 1/2017 | Park et al. | |
| 9,661,777 B2 | 5/2017 | Mills et al. | |
| 9,829,960 B2 | 11/2017 | Pachoud et al. | |
| 2015/0049476 A1* | 2/2015 | Hsia | F21S 8/00 362/223 |
| 2017/0163245 A1* | 6/2017 | Iyer | H02J 3/26 |
| 2018/0043656 A1 | 2/2018 | Song et al. | |
| 2019/0364687 A1* | 11/2019 | Gilges | H05K 7/1497 |
| 2020/0295543 A1* | 9/2020 | Kim | H02B 13/025 |
| 2020/0371075 A1 | 11/2020 | Arigo et al. | |
| 2021/0111555 A1* | 4/2021 | Schweitzer, III | H02J 13/0004 |
| 2021/0159691 A1* | 5/2021 | Chowdhury | H02H 3/165 |
| 2021/0184873 A1* | 6/2021 | Breedy | H04L 67/1097 |
| 2021/0384736 A1* | 12/2021 | Bhavaraju | H02J 3/40 |
| 2022/0209525 A1* | 6/2022 | Chowdhury | G01R 31/08 |

FOREIGN PATENT DOCUMENTS

| | | |
|---|---|---|
| CN | 104672803 A | 6/2015 |
| CN | 104672809 A | 6/2015 |
| CN | 106380800 A | 2/2017 |
| CN | 107814944 A | 3/2018 |

(Continued)

*Primary Examiner* — Christopher P McAndrew
*Assistant Examiner* — Zannatul Ferdous
(74) *Attorney, Agent, or Firm* — Dority & Manning, P.A.

(57) ABSTRACT

Systems for improvements in electrical power distribution and monitoring systems for data centers. A system can include a circuit breaker, a set of phased current transformers (CTs), a neutral CT, and a metering device. The circuit breaker can be mounted in a first enclosure. Additionally, the set of phased CTs can be positioned in a first component arrangement of a second enclosure. The set of phased CTs can be coupled to the circuit breaker and be configured to measure a current value flowing through the circuit breaker. Moreover, the neutral CT can be positioned in a second component arrangement of the second enclosure. The neutral No errors found. CT can be coupled to the circuit breaker. Furthermore, the metering device can be configured to transmit data associated with the current value to a display device.

18 Claims, 11 Drawing Sheets

(56) References Cited

FOREIGN PATENT DOCUMENTS

| | | |
|---|---|---|
| CN | 108948688 A | 12/2018 |
| CN | 112011155 A | 12/2020 |
| CN | 112552658 A | 3/2021 |
| CN | 112759900 A | 5/2021 |
| DE | 102017131048 A1 | 6/2019 |
| EP | 3845355 A1 | 7/2021 |

\* cited by examiner

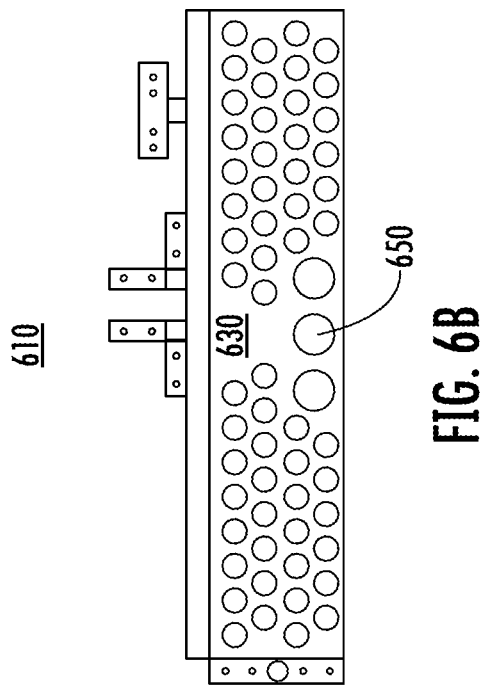
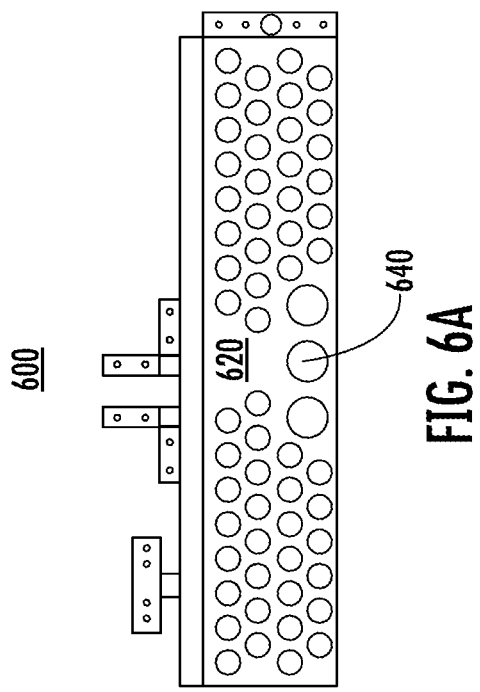

ELECTRICAL POWER DISTRIBUTION AND MONITORING SYSTEM FOR DATA

FIELD

The present disclosure relates generally to data centers, and, more particularly, to the electrical power distribution and monitoring systems for data centers.

BACKGROUND

Organizations often perform computer operations using data centers. A data center can accommodate a large amount of server, network, and computer equipment to process, store, and exchange data as needed to perform the operations of an organization. Electrical power can be distributed by a power distribution system to a large number of locations throughout the data center. A monitoring system can be connected to is a power distribution system to enable modern data centers to function more efficiently.

SUMMARY

Aspects and advantages of embodiments of the present disclosure will be set forth in part in the following description, or may be learned from the description, or may be learned through practice of the embodiments.

One example aspect of the present disclosure is directed to a system. The system includes a first set of phased current transformers (CTs) positioned in a first component arrangement of a second enclosure. The first set of phased CTs is coupled (e.g., connected, magnetically coupled) to the circuit breaker. The first set of phased CTs is configured to measure a current value flowing through the circuit breaker. Moreover, the system includes a first neutral current transformer (CT) positioned in a second component arrangement of the second enclosure. The first neutral CT is coupled to the circuit breaker. Furthermore, the system includes a metering device, wherein the metering device is configured to transmit data associated with the current value to a display system. In some instances, the metering device can transmit to a display system. In some instances, the second enclosure can include a plurality of sets of phased CTs and a plurality of neutral CTs.

In some instances, the system is a low voltage electrical power distribution system operating at a maximum voltage of about 600 volts.

In some instances, the system includes one or more racks, and a first RPP and a second RPP for each of the one or more racks. The first RPP is positioned adjacent to a first end of a given rack, and the second RPP is positioned adjacent to a second end of the given rack.

In some instances, the metering device is mounted in a third enclosure, and the third enclosure is located below the first enclosure and the second enclosure.

In some instances, the system further includes a second set of phased current transformers (CTs) positioned in a first component arrangement of a fourth enclosure. Additionally, the system includes a second neutral current transformer (CT) positioned in a second component arrangement of the fourth enclosure. The first enclosure is a compartment located between the second enclosure and the fourth enclosure, and the first enclosure includes a main power distribution bus and a plurality of circuit breakers. The plurality of circuit breakers includes a first set of circuit breakers that are coupled to a plurality of current transformers housed within the second enclosure and a second set of circuit breakers that are coupled to a plurality of current transformers housed within the fourth enclosure.

In some instances, the first set of phased CTs includes split-core CTs.

In some instances, the first set of phased CTs are individually mounted on an insulated support in a staggered arrangement and positioned laterally adjacent to the circuit breaker. Additionally, the first neutral CT is mounted above the first set of phased CTs.

In some instances, the metering device converts an analog signal from the first set of CTs to digital data, and the metering device stores the digital data.

In some instances, the metering device transmits, using an RJ-45 connector, the data associated with the current value to the display device. The display device is a remote device located outside the system.

In some instances, the system further includes an upper cable management compartment having three openings for incoming conductors and multiple openings (e.g., ten or more openings) for outgoing branch conductors.

In some instances, the system includes side-mounted terminal strips for ground conductors.

In some instances, the first enclosure and the second enclosure are independently accessible from the same surface of the system. Additionally, each of the enclosures (e.g., first enclosure, second enclosure, third enclosure, fourth enclosure, fifth enclosure) can be independently accessible.

Another example aspect of the present disclosure is directed to a system having a rack, a first power distribution and monitoring system and a second power distribution and monitoring system. The first power distribution and monitoring system can be positioned adjacent to a first end of the rack. The second power distribution and monitoring system can be positioned adjacent to a second end of the rack. The first and second power distribution and monitoring systems respectively can include a circuit breaker, a first set of phased current transformers (CTs), a first neutral current transformer (CT), and a metering device. The circuit breaker can be mounted in a first enclosure. The first set of phased CTs can be positioned in a first component arrangement of a second enclosure and can be coupled to the circuit breaker. Additionally, the first set of phased CTs can be configured to measure a current value flowing through the circuit breaker. The first neutral CT can be positioned in a second component arrangement of the second enclosure and can be coupled to the circuit breaker. The metering device can be configured to transmit data associated with the current value to a display device.

Yet another example aspect of the present disclosure is directed to a system having one or more racks, one or more servers, and a power distribution and monitoring system. The one or servers can be positioned relative to the one or more racks. The power distribution and monitoring system can be coupled to the one or more racks. The power distribution and monitoring system can include a first circuit breaker and a second circuit breaker mounted in a first enclosure. Additionally, the power distribution and monitoring system can include a first set of phased current transformers (CTs) positioned in a first component arrangement of a second enclosure. The first set of phased CTs can be coupled to the first circuit breaker, and the first set of phased CTs are configured to measure a current value flowing through the first circuit breaker. Moreover, the power distribution and monitoring system can include a first neutral current transformer (CT) positioned in a second component arrangement of the second enclosure. The first neutral CT can be coupled to the circuit breaker. The power distribution and monitoring system can include a metering device mounted in a third enclosure, where the metering device can be configured to transmit data associated with the current value to a display device. The power distribution and monitoring system can include a second set of phased current transformers (CTs) positioned in a first component arrangement of a fourth enclosure. The second set of phased CTs can be coupled to the second circuit breaker. Furthermore, the power distribution and monitoring system can include a second neutral current transformer (CT) positioned in a second component arrangement of the fourth enclosure.

Another example aspect of the present disclosure is directed to a monitoring system having a first set of phased current transformers (CTs) positioned in a first component arrangement of a first enclosure. The first set of phased CTs can measure a current value from through a circuit breaker. Additionally, the monitoring system can include a first neutral current transformer (CT) positioned in a second component arrangement of the first enclosure. The, the first neutral CT can be connected to a neutral bus. Moreover, the monitoring system can include a metering device. The metering device can be configured to transmit data associated with the current value to a display device.

Other example aspects of the present disclosure are directed to other systems, methods, vehicles, apparatuses, tangible non-transitory computer-readable media, and devices for coordinated display of related content across a distributed set of electronic devices.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which:

FIGS. 6A-6B depict respective top views of a power distribution and monitoring system according to example embodiments of the present disclosure.

Figure 1:
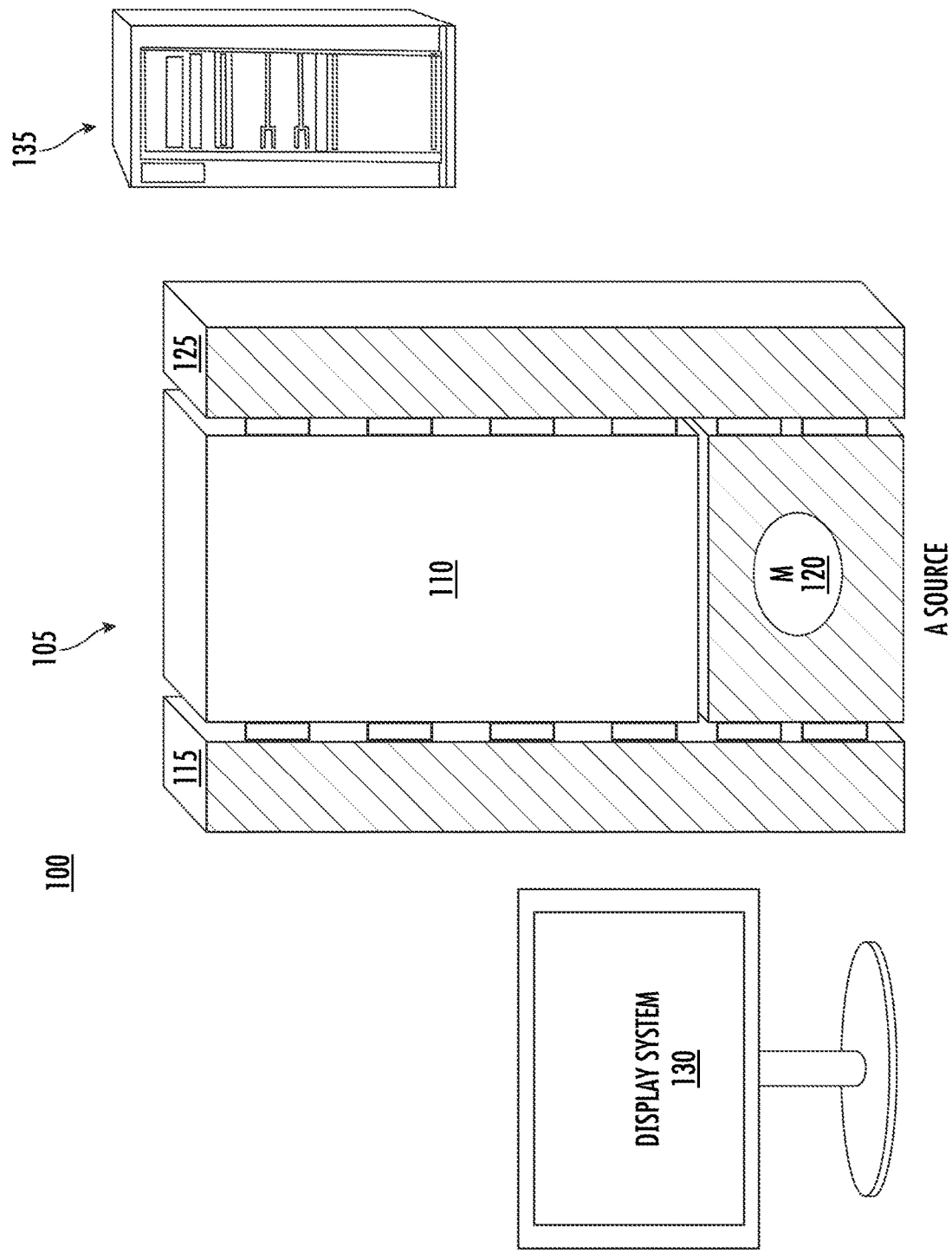
FIG. 1 depicts a low voltage electrical power distribution and monitoring system according to example embodiments of the present disclosure.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Generally, the present disclosure is directed to improvements in electrical power distribution and monitoring systems for data centers. A data center includes any computing facility or portion of a facility in which computer operations are carried out. A data center may include computing devices (e.g., servers) dedicated to specific functions or serving multiple functions. Examples of computer operations include electronic data storage, information processing, communications, and operational control.

For example, an organization, such as but not limited to a transport service provider, utilizes data centers to accommodate a large amount of server, network, and computer equipment to process, store, and exchange data as needed to perform the operations of an organization. The data center can include server racks that contain a large number of servers which require a large amount of electrical power to operate. A server rack can include a computing system that includes one or more computing devices mounted in a rack.

Electrical power can be distributed by a power distribution unit (PDU) to a large number of locations throughout the data center. The PDU can include any device, module, component, or combination thereof, that can be used to distribute electrical power. The elements of a PDU may be distributed among two or more components (e.g., a transformer and a rack power distribution unit, each housed in a separate enclosure, and associated cables). A power distribution unit may include transformer, power monitoring, fault detection, and/or isolation components.

The PDUs may need to be serviced or maintained from time to time. Typically, service or maintenance can only be performed when the power distribution units are powered off. The downtime associated with maintenance and service of the power distribution units may result in a significant loss in computing resources. In some critical systems, such as systems associated with a transport service provider, downtime may result in significant disruption to the service provided to the users (e.g., a ridesharing service, delivery service, vehicle fleet management, other transportation-related service, or the like).

An electrical power distribution and monitoring system allows for data centers to function more efficiently by having monitoring capabilities. However, conventional distribution and monitoring systems may have limited system monitoring capabilities, or may have a vendor-specific, inflexible, monitoring system with drawbacks pertaining to installation, maintenance, component access, and more. An improved design is needed to address many of these drawbacks, and to significantly improve the state of the art in the monitoring system design.

According to some embodiments, the power distribution and monitoring system can include a remote power panel (RPP) as the power distribution system, and a monitoring system that is connected to the RPP to improve the functionality and efficiency of the power distribution system. In some instances, the low voltage electrical power distribution and monitoring system can include the PDU. The low voltage electrical power distribution and monitoring system allows for modern data centers to function more efficiently. Techniques described herein include an improved design and functionality to address many of the drawbacks associated with conventional power distribution and monitoring systems.

In some instances, the system described herein can provide power distribution extensions from PDUs directly to server racks with several benefits such as improved distribution capacity, better cooling, smaller footprint, server layout flexibility, and more efficient maintenance. For example, the system can provide circuit infrastructure to expand server capacity without adding additional PDUs. Additionally, the system, or individual circuits, can be shut down for maintenance while the associated PDU remains powered up. The system can include any panel, device, module, component, or combination thereof, that can be used to transfer or distribute electrical power. The system can be housed in one or more enclosures/compartments. The power distribution and monitoring system can distribute electrical power to some or all of the many servers in the rack. The power distribution and monitoring system can include circuit breakers and other electronic components to supply power to one or more distinct servers in the server rack. The system may be positioned to each side of the server rack. The server rack can be a computing system that includes one or more computing devices (e.g., server devices) mounted in a rack.

In some instances, a data center can include a plurality of data halls, where each data hall includes a plurality of server racks (e.g., hundreds of server racks). The server racks can be configured for storage of computing devices such as but not limited to server devices. A power distribution and monitoring system can provide power to the computing devices positioned relative to the racks. In some implementations, each rack can have two sources of power, a first power distribution and monitoring system positioned adjacent to a first end of a rack (referred to herein as an A-side power source) and a second power distribution and monitoring system positioned adjacent to a second end of a rack (referred to herein as a B-side power source).

One or more monitoring systems can measure an amount of current that is flowing to computing devices within each rack from the power distribution system. The monitoring system(s) allow for analysis of the power flow, determine trending over a period of time, and can include a notifications system to send alarms if needed. In conventional systems, the monitoring system(s) can be connected to busway systems (i.e., an example of a power distribution system), which are metal-enclosed buses that hang above each rack and are connected to a central monitoring system. In some cases, the busway systems are spread out (e.g., 40 feet long) across an entire data hall. The busway systems can be cumbersome and have many drawbacks, such as not being compact.

A power distribution and monitoring system in accordance with the disclosed technology can include a centrally located power panel connected to one or more racks from the power panel or below each data hall to a rack location. In conventional systems, a current transformer (CT), which can be used to measure the current to each rack, can be soldered onto a strip. The strip can be connected to the monitoring system. The strip can be a single unit which can have a plurality of CTs soldered on it. One of the drawbacks of having all the CTs soldered on the strip is that when one CT becomes non-functional, an operator needs to replace the strip with all of the CTs soldered on the strip. For example, if there are 42 CTs connected to the strip, then when one CT becomes non-functional, then all 42 CTs need to be replaced. By having to replace the entire strip, the operator needs to shut down the panel and racks for an extended period of time, even though there may be 41 functioning CTs in the strip.

Techniques described herein allow for the installation of each of the CTs (e.g., split core CTs) independently and connect each CT to the monitoring unit in order to minimize the amount of downtime if a single CT becomes non-functional. Additionally, providing the CTs in separate enclosures from the circuit breakers helps to facilitate safe accessibility of the electrical components which reduces the likelihood of an operator being shocked when replacing the CTs.

Generally, the present disclosure is directed to improvements in the design of low voltage electrical power distribution and monitoring systems. For example, the system can include a compartmentalized low voltage electrical power distribution system enclosure, with integral, individually replaceable, circuit monitoring and metering components. The system can further include a central, rectangular cuboid compartment that houses the main power distribution buses and branch circuit protection devices (e.g., circuit breakers). In some instances, on each side of the central compartment is an instrumentation chamber. The instrumentation chambers include split core, phase and neutral current transformers (CTs) that can be installed to measure current flowing through circuit conductors. The phase CTs can be individually mounted on an insulating support in a staggered arrangement, directly adjacent to the circuits they monitor, while the neutral CTs can be group mounted towards the top of the instrumentation chamber. A metering compartment can be located below the main compartment and instrumentation chambers, and houses electronic metering devices to interpret, store, and transmit data collected from the CTs. Additionally, the system can include three pass-through type Ethernet jacks that are located on each side of the metering compartment's rear facing panel, which can allow electrical connectivity (e.g., RJ-45 connectivity) to remote monitoring and display systems. Furthermore, the system can include an upper cable management compartment that features designated openings for incoming main, and outgoing branch circuit conductors including side-mounted terminal strips for ground conductors.

The technology of the present disclosure can provide a number of benefits and technical effects. For instance, the technology of the present disclosure can allow each compartment to accommodate devices from multiple equipment manufacturers. The system can be vendor agnostic. Additionally, the individually mounted CTs enable replacement of a single defective component without impacting non-defective components. Moreover, the staggered CT arrangement allows for a compact instrumentation solution, without requiring completely integrated CT printed circuit boards. Furthermore, the externally mounted Ethernet jacks allow for easier and safer remote connectivity by eliminating the need to access energized internal parts. Each compartment or chamber can be independently front accessible.

In some instances, a data center includes a plurality of server racks to execute software systems. The power distribution and monitoring system can power the server racks in data centers. For example, the server rack can have two power distribution and monitoring systems on each side (e.g., A-side, B-side). The power distribution and monitoring system can also measure the amount of electric current to each server rack, and perform analysis based on the measured electric current. According to some embodiments, the power distribution and monitoring system can perform trending analysis, generate alarm notifications, and generate reports.

In conventional systems, a datacenter can be powered using busway electrical distribution systems. The busway system can be installed (e.g., hang) above each rack or above an entire row of racks, which can then be fed down from the busway system to each rack location. The monitoring system of a busway system would connect each rack to a head-end-unit, and the head-end-unit can be connected to a central monitoring system. One of the drawbacks of the busway system is that the entire monitoring system is not compact because it can spread across an entire row, and the entire row can be long (e.g., 40 feet), which can make the installation cumbersome.

Alternatively, instead of using a busway system, a datacenter can be powered using a centrally located power panel. The power panel can include a branch circuit that originates at the centrally located power panel and feeds electricity throughout the server racks. The branch circuit can be connected from the power panel to each rack location.

The power panel can include a monitoring system. In conventional systems, the power panel can have current transformers (CTs) that are soldered on a CT strip. The CT strip can be a single unit that monitors each circuit associated with a CT. For example, a plurality of CTs (e.g., 42 CTs) can be soldered on the CT strip to monitor the plurality of currents associated with each CT. A drawback of such a conventional monitoring system includes having to replace the whole strip when one of the CTs malfunctions. As a result, all of the CTs that are soldered on the CT strip have to be replaced, instead of just replacing the one malfunctioning CT. Additionally, in order to replace the CT strip, the power panel must be shut down for an extended period of time.

Techniques described herein improve the power distribution and monitoring of power panels by minimizing the amount of downtime when a single CT malfunctions and needs to be replaced. With reference now to the figures, example aspects of the present disclosure will be discussed in further detail.

FIG. 1 depicts an electrical power distribution and monitoring system 100 according to example embodiments of the present disclosure. For example, the system 100 can be a low voltage (e.g., less than 600 volts) power distribution and monitoring system 105. The system 100 can include a first enclosure 110 having a panel board with circuit breakers, a second enclosure 115 having a first set of current transformers, a third enclosure 120 having a metering system, and a fourth enclosure 125 having a second set of current transformers. In some embodiments, the first enclosure 110 houses power distribution components of system 100 (e.g., corresponding to a remote power panel (RPP)), while the remaining enclosures (e.g., second enclosure 115, third enclosure 120, and/or fourth enclosure 125) correspond to power monitoring components of system 100.

In conventional systems, as later described in FIG. 10, a conventional power distribution and monitoring system can include solid core CTs that are soldered to an electrical circuit board inside the power panel. As previously mentioned, all of the CTs have to be replaced when just one CT malfunctions. Additionally, because the CTs are in the same enclosure as some of the circuit breakers, the power distribution and monitoring system needs to be shut down in order to replace the CTs.

Techniques described herein improve the design and functionality of a power distribution and monitoring system. According to some embodiments, the system 100 can include a power distribution and monitoring system 105 coupled to one or more racks 135. For example, the one or more racks 135 can be one or more server racks. For example, the power distribution system can be a remote power panel (RPP). One or more circuit breakers can be mounted in a first enclosure 110. The RPP can be an example of the first enclosure 110. Additionally, the circuit breakers can be three-pole circuit breakers that are coupled to a power supply (e.g., mounted to a power distribution bus). In some instances, the first enclosure 110 can include a main power distribution bus and a plurality of circuit breakers. For each one of the circuit breakers, a branch circuit conductors can connect the circuit breaker to a set of phased current transformers, and then exit through the top of the panel to one of the server racks.

The first set of phased current transformers (CTs) can be positioned in a first component arrangement of a second enclosure 115. A current transformer can be a type of an instrument transformer that can reduce an alternating current by producing a current that is proportional to the current in the circuit breaker. The first set of phased CTs can be coupled to a first portion of the circuit breakers that are mounted in the first enclosure 110. The first set of phased CTs can be configured to measure a current value flowing through the circuit breakers. Additionally, by positioning the first set of phased CTs together, the design allows for a more compact installation. Moreover, the first set of phased CTs can be associated with a first neutral CT.

In some instances, the first set of phased CTs can be individually mounted on an insulated support in a staggered arrangement and positioned laterally adjacent to the circuit breaker(s).

In some instances, the first set of phased CTs include split core CTs. Split core CTs can provide accurate measurement of electrical systems and feature a removable latch for easy installation without disconnecting wires or interrupting power. For example, split core CTs can have a split in the core that allows the CTs to open and be placed around the conductor without having to disconnect the conductor or disrupt the wiring. The split-core CT can contain a transformer in which one of the cores to position around the conductor can be opened or moved and then locked with a latch. The split core CT can be retrofitted without disrupting it into a live network. This noninvasive installation and removal approach provides for quicker installation with no disruption of service. Additionally, by using split core CTs, the design is more compact, which results in the power distribution and monitoring system having more CTs and circuit breakers than conventional systems. Furthermore, the CTs used in conventional systems require the circuit to be disconnected in order to remove or install the CT. Using techniques described herein, the power distribution and monitoring system can utilize split-core CTs which can be removed or installed without having the circuit be disconnected, which reduces the amount of downtime for the servers.

Additionally, the system can include a first neutral current transformer (CT) positioned in a second component arrangement of the second enclosure 115. The first neutral CT can also be coupled to the circuit breaker. In some instances, the first neutral CT can be mounted adjacent (e.g., above, below, to the left of, to the right of) the first set of phased CTs. For example, the first neutral CT can be mounted above the first set of phased CTs.

Furthermore, the metering device can be positioned (e.g., mounted) in the third enclosure 120. The metering device can transmit data associated with the current value to a display system 130. For example, the third enclosure 120 can be located below the first enclosure 110 and the second enclosure 115. The metering device can convert an analog signal from the first set of CTs to digital data. The metering device can also store the digital data.

In some instances, the metering device can transmit, using an electrical connector (e.g., an RJ-45 connector), the data associated with the respective CT current values to the display system 130, wherein the display system 130 is a remote device located outside the power distribution and monitoring system 105.

In some instances, the system 100 can be a low voltage electrical power distribution system operating at a maximum voltage of about 600 volts.

In some instances, the power distribution and monitoring system 105 can further include a second set of phased current transformers (CTs) positioned in a first component arrangement of a fourth enclosure 125. Additionally, the power distribution and monitoring system 105 can include a second neutral current transformer (CT) positioned in a second component arrangement of the fourth enclosure 125. Moreover, the first enclosure 110 can be a compartment located between the second enclosure 115 and the fourth enclosure 125. Furthermore, the plurality of circuit breakers can include a first set of circuit breakers that are coupled to a plurality of current transformers housed within the first enclosure 115 and a second set of circuit breakers that are coupled to a plurality of current transformers housed within the fourth enclosure 125.

Additionally, the system 100 can include a second neutral current transformer (CT) positioned in a second component arrangement of the fourth enclosure 125. The second neutral CT can also be coupled to the circuit breaker. In some instances, the second neutral CT can be mounted adjacent (e.g., above, below, to the left of, to the right of) the second set of phased CTs.

In some instances, the second set of phased CTs can be individually mounted on an insulated support in a staggered arrangement and positioned laterally adjacent to the circuit breaker.

In some instances, the power distribution and monitoring system 105 can further include an upper cable management compartment having three openings for incoming conductors and multiple openings for outgoing branch conductors. FIGS. 6A and 6B further describes the upper cable management compartment.

In some instances, the power distribution and monitoring system can include side-mounted terminal strips for ground conductors.

In some instances, at the first enclosure 110 and the second enclosure 115 are independently accessible from the same surface of the power distribution and monitoring system 105 (e.g., a front surface of the power distribution and monitoring system 105 depicted in FIG. 1). In some instances, the first enclosure 110, the second enclosure 115, the third enclosure 120, and the fourth enclosure 125 are independently accessible from the same surface of power distribution and monitoring system 105 (e.g., a front surface).

Figure 2:
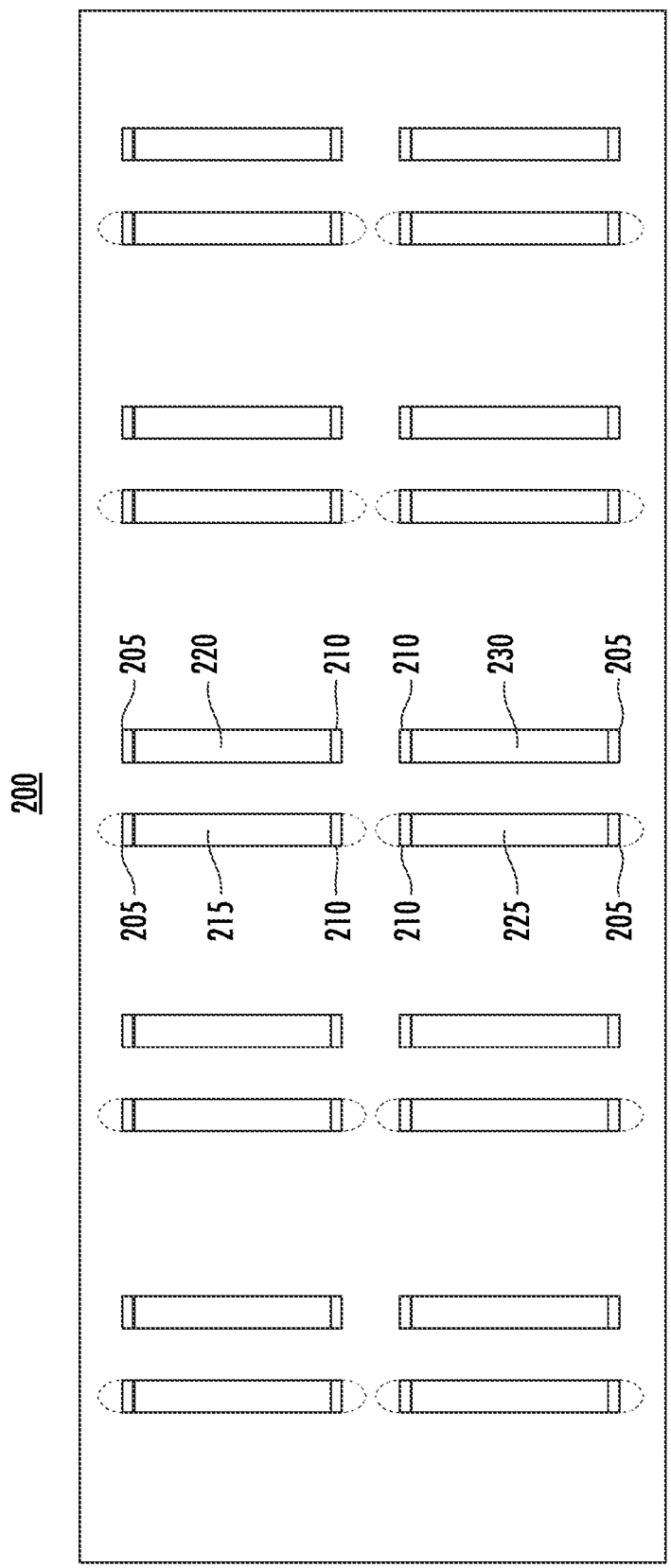
FIG. 2 depicts a data hall according to example embodiments of the present disclosure.

FIG. 2 depicts a data hall 200 according to example embodiments of the present disclosure. A data center can have a plurality of data halls 200.

According to some embodiments, the data hall 200 can have a plurality of racks 215, 220, 225, 230. In some instances, the system (e.g., system 100) can include a first power distribution and monitoring system 205 and a second power distribution and monitoring system 210 for each of the one or more racks 215, 220, 225, 230. For example, the power distribution and monitoring system 105 described in FIG. 1 can be an example of the first power distribution and monitoring system 205 and the second power distribution and monitoring system 210. The first power distribution and monitoring system 205 can be positioned adjacent to a first end of a given rack 215. Additionally, the second power distribution and monitoring system 210 can be positioned adjacent to a second end of the given rack 215.

Another example aspect of the present disclosure is directed to a system having a rack, a first power distribution and monitoring system, and a second power distribution and monitoring system. The first power distribution and monitoring system can be positioned adjacent to a first end of the rack. The second power distribution and monitoring system can be positioned adjacent to a second end of the rack. The first power distribution and monitoring system and the second power distribution and monitoring system respectively can include a circuit breaker, a first set of phased current transformers (CTs), a first neutral current transformer (CT), and a metering device. The circuit breaker can be mounted in a first enclosure. The first set of phased CTs can be positioned in a first component arrangement of a second enclosure and can be coupled to the circuit breaker. Additionally, the first set of phased CTs can be configured to measure a current value flowing through the circuit breaker. The first neutral CT can be positioned in a second component arrangement of the second enclosure and can be coupled to the circuit breaker. The metering device can transmit data associated with the current value to a display system.

In some instances, the first power distribution and monitoring system and the second power distribution and monitoring system respectively can include a second set of phased current transformers (CTs) positioned in a first component arrangement of a fourth enclosure and a second neutral current transformer (CT) positioned in a second component arrangement of the fourth enclosure.

In some instances, the first enclosure can be a compartment located between the second enclosure and the fourth enclosure, and wherein the first enclosure includes a main power distribution bus and a plurality of circuit breakers.

In some instances, the plurality of circuit breakers can include a first set of circuit breakers that are coupled to a plurality of current transformers housed within the second enclosure and a second set of circuit breakers that are coupled to a plurality of current transformers housed within the fourth enclosure.

Yet another example aspect of the present disclosure is directed to a system having one or more racks, one or more servers, and a power distribution and monitoring system. The one or servers can be positioned relative to the one or more racks. The power distribution and monitoring system can be coupled to the one or more racks. The power distribution and monitoring system can include a first circuit breaker and a second circuit breaker mounted in a first enclosure. Additionally, the power distribution and monitoring system can include a first set of phased current transformers (CTs) positioned in a first component arrangement of a second enclosure. The first set of phased CTs can be coupled to the first circuit breaker, and the first set of phased CTs are configured to measure a current value flowing through the first circuit breaker. Moreover, the power distribution and monitoring system can include a first neutral current transformer (CT) positioned in a second component arrangement of the second enclosure. The first neutral CT can be coupled to the circuit breaker. The power distribution and monitoring system can include a metering device mounted in a third enclosure, where the metering device can transmit data associated with the current value to a display system. The power distribution and monitoring system can include a second set of phased current transformers (CTs) positioned in a first component arrangement of a fourth enclosure. The second set of phased CTs can be coupled to the second circuit breaker. Furthermore, the power distribution and monitoring system can include a second neutral current transformer (CT) positioned in a second component arrangement of the fourth enclosure.

According to another embodiment, the system may only include the monitoring system. For example, the system can include a first set of phased current transformers (CTs) positioned in a first component arrangement of a first enclosure. The first set of phased CTs can measure a current value from through a circuit breaker. For example, the circuit breakers can be connected to the monitoring system, while not forming a part of the monitoring system. Additionally, the monitoring system can include a first neutral current transformer (CT) positioned in a second component arrangement of the first enclosure. The first neutral CT can be connected to a neutral bus. Moreover, the monitoring system can include a metering device. The metering device can be configured to transmit data associated with the current value to a display device.

Figure 3B:
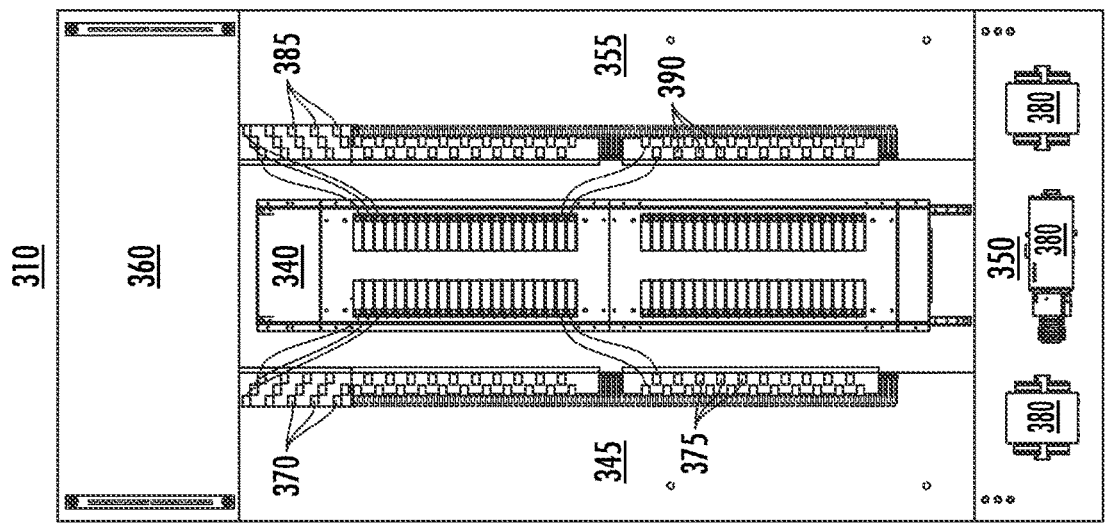
FIGS. 3A-3B depict respective front views of a power distribution and monitoring system according to example embodiments of the present disclosure.
Figure 3A:
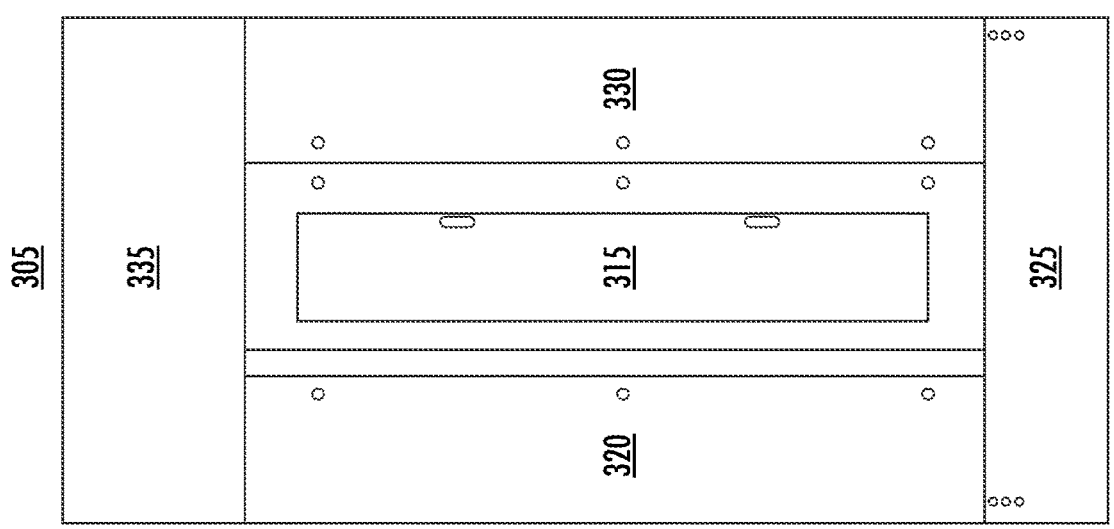

FIGS. 3A-3B depict respective front views of a power distribution and monitoring system 305, 310 according to example embodiments of the present disclosure. FIG. 3A depicts the front view of a power distribution and monitoring system 305 with the enclosure doors closed. The power distribution and monitoring system 305 of FIG. 3A includes a first enclosure 315, a second enclosure 320, a third enclosure 325, a fourth enclosure 330, and an upper cable management compartment 335. FIG. 3B depicts the front view of a power distribution and monitoring system 310 with the enclosure doors opened. The power distribution and monitoring system 310 of FIG. 3B includes a first enclosure 340, a second enclosure 345, a third enclosure 350, a fourth enclosure 355, and an upper cable management compartment 360.

In some instances, the first enclosure 315, 340 can include a main power distribution bus and a plurality of circuit breakers 365, 395.

According to an example embodiment, when the circuit breaker 365 is a three-pole circuit breaker, three different phased wires can be connected from the three-pole circuit breaker to the three phased CTs 375. The phased CTs 375 can be grouped laterally adjacent to each circuit breaker 365. Additionally, one single neutral wire can be connected from the neutral bus 371 to the neutral CT 370.

Furthermore, all the neutral CTs 370 can be positioned together for a more compact installation. In some instances, the plurality of neutral CTs 370 can be positioned above the different set of phased CTs 375.

The second enclosure 320, 345 can include a plurality of first phased current transformers (CTs) 375 positioned in a first component arrangement of the second enclosure. For example, a first set (e.g., 3 CTs) of phased CTs 375 can be coupled to a first circuit breaker 365. The first set of phased CTs 375 can be configured to measure a current value of the electric current flowing through the circuit breaker 365. For example, a first phased CT in the first set of phased CTs 375 can measure the electric current in a first phase flowing through the circuit breaker 365, while a second phased CT in the first set of phased CTs 375 can measure the electric current in a second phase flowing through the circuit breaker 365, and a third phased CT in the first set of phased CTs 375 can measure the electric current in a third phase flowing through the circuit breaker 365. For alternating current (AC) power distribution, the first phase measured by the first phased CT, the second phase measured by the second phased CT, and the third phase measured by the third phased CT can all be offset from one another (e.g., offset from one another by 120 degrees).

Additionally, the second enclosure 320, 345 can include a first set of neutral current transformers (CTs) 370 positioned in a second component arrangement of the second enclosure. The first set of neutral CTs 370 can also be coupled to respective circuit breakers 365.

In some instances, the first enclosure 315, 340 and the second enclosure 320, 345 can be independently accessible from a same surface of the power distribution and monitoring system 305, 310. Additionally, in some embodiments, all of the different enclosures (e.g., first enclosure, second enclosure, third enclosure, fourth enclosure) can be independently accessible.

The third enclosure 325, 350 can include a metering device 380. The metering device 380 can transmit data associated with the current value of the electric current flowing through the circuit breakers 365 to a display system. The metering device 380 can convert an analog signal from the first set of CTs to digital data, and the metering device can store the digital data.

In some instances, the metering device 380 can include two wiring harnesses on either side of the third enclosure 325, 350 in order to make the power distribution and monitoring system side agnostic. The wiring harness can have wires that are connected to the CTs in the second enclosure 320, 345 and to the CTs in the fourth enclosure 330, 355. The metering device 380 can also include an electronic component (e.g., head-end-unit) that converts the analog signal (e.g., current flowing through the CTs) received from the CTs into digital data. The digital data (e.g., current value) can be stored by a head-end-unit of the metering device 380. The head-end-unit can be positioned between the two wiring harnesses. The head-end-unit can aggregate the digital data and allow a user to access the data remotely. For example, the data can be presented in the display system 130 of FIG. 1. The metering device 380 can also include a circuit breaker and a power supply to provide power to the metering device 380.

For example, the metering device 380 can measure the amount of current that is flowing through each of the circuit conductors by using the corresponding CT for each circuit conductor. The metering device 380 can measure the amount of electric current flowing in a conductor. The metering device 380 can use current and voltage measurements to calculate power and energy (e.g., kW and kWh). For example, a voltage reference can be taken from the main bus and passed to the metering device 380. Additionally, the data transmitted by the metering device 380 can include any data associated with the power distribution and monitoring system that can be measured, which can include power and voltage measurements.

The metering device 380 can also be a low voltage monitoring system. For example, the low voltage monitoring system can be a monitoring system below a certain voltage threshold (e.g., 600 volts). In some instances, the low voltage monitoring system can monitor a certain voltage range (e.g., between 600 volts and 240 volts, between 220 volts and 40 volts).

The fourth enclosure 330, 355 can include a plurality of second phased current transformers (CTs) 385 positioned in a first component arrangement of the fourth enclosure. For example, a second set (e.g., 3 CTs) of phased CTs 385 can be coupled to a second circuit breaker 395. The second set of phased CTs 385 can be configured to measure a current value of the electric current flowing through the second circuit breaker 395. For example, a first phased CT in the second set of phased CTs can measure a first phase of the electric current flowing through the circuit breaker, while a second phased CT in the second set of phased CTs can measure a second phase of the electric current flowing through the circuit breaker, and a third phased CT in the second set of phased CTs can measure a third phase of the electric current flowing through the circuit breaker. For alternating current (AC) power distribution, the first phase measured by the first phased CT, the second phase measured by the second phased CT, and the third phase measured by the third phased CT can all be offset from one another (e.g., offset from one another by 120 degrees). Additionally, the second enclosure 330, 355 can include a second set of neutral current transformer (CT) 390 positioned in a second component arrangement of the second enclosure. The second neutral CT 390 can be coupled to the second circuit breaker 395.

In some instances, the first enclosure 315, 340 and the fourth enclosure 330, 355 can be independently accessible from the same surface of the power distribution and monitoring system 305, 310.

The upper cable management compartment 335, 360 of the power distribution and monitoring system 305, 310 can include three openings (not pictured) for incoming conductors and multiple openings for outgoing branch conductors.

In some instances, the first set of phased CTs 370 and the second set of phased CTs 385 can be split core CTs. The first set of phased CTs 370 can be individually mounted on an insulated support in a staggered arrangement and positioned laterally adjacent to the first circuit breaker 365. The second set of phased CTs 385 can be individually mounted on an insulated support in a staggered arrangement and positioned laterally adjacent to the second circuit breaker 395. Additionally, the first neutral CT 375 can be mounted below the first set of phased CTs 390. The second neutral CT 390 can be mounted below the second set of phased CTs 385.

Figure 4B:
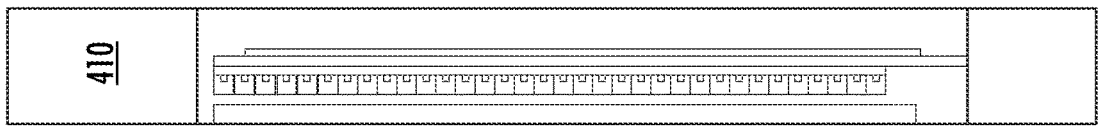
FIGS. 4A-4B depict respective side views of a power distribution and monitoring system according to example embodiments of the present disclosure.
Figure 4A:

FIGS. 4A-4B depict respective side views 400, 405 of a power distribution and monitoring system 410 according to example embodiments of the present disclosure. FIG. 4A depicts a first side 400 of the power distribution and monitoring system 410. FIG. 4B depicts the second side 405 of the power distribution and monitoring system 410. The power distribution and monitoring system 410 is side agnostic and therefore can be installed on either side of a server rack.

Figure 5:
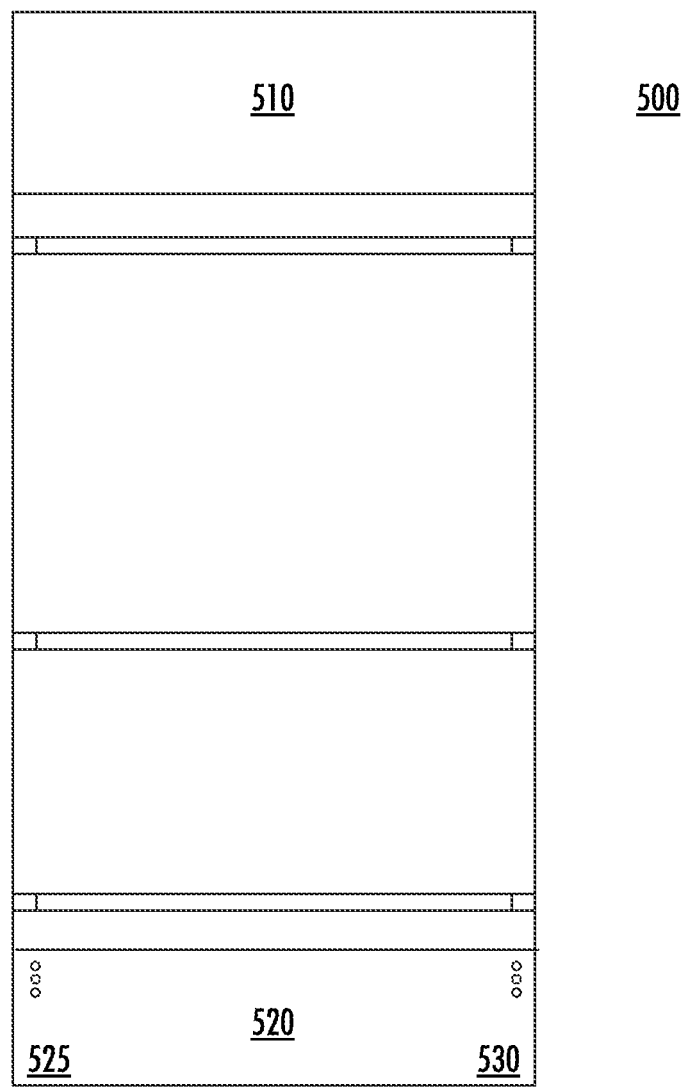
FIG. 5 depicts a back view of a power distribution and monitoring system according to example embodiments of the present disclosure.

FIG. 5 depicts a back view 500 of a power distribution and monitoring system 510 according to example embodiments of the present disclosure. In some instances, the metering device 520 (e.g., enclosed in a third enclosure) can transmit, using an electrical connector (e.g., an RJ-45 connector) 525, 530, the data associated with the current value to a display system. The RJ-45 connector 525, 530 can be positioned on both sides of the metering device 520 so that the power distribution and monitoring system 510 can be side-agnostic during an installation. The display system (not pictured) can be a remote device located outside the power distribution and monitoring system 510.

FIG. 6A depicts a top view 600 of a first power distribution and monitoring system 620 to be installed on a first side (e.g., left side) of a server rack according to example embodiments of the present disclosure. FIG. 6B depicts a top view 610 of a power distribution and monitoring system 630 to be installed on a second side (e.g., right side) of the server rack according to example embodiments of the present disclosure.

According to some embodiments, the first power distribution and monitoring system 620 can include an upper cable management compartment having three openings 640 for incoming conductors and multiple openings for branch circuit conductors. Similarly, the second power distribution and monitoring system 630 can include an upper cable management compartment having three openings 650 for incoming conductors and multiple openings for outgoing branch circuit conductors. By having three openings 640, 650, instead of just two openings, for both the first power distribution and monitoring system 620 and the second power distribution and monitoring system 630, the power distribution and monitoring systems can be side agnostic during installation. Additional symmetry of the top panel of power distribution and monitoring system 620 and power distribution and monitoring system 630 is intended to facilitate power distribution and monitoring system design as being side agnostic so that a given power distribution and monitoring system can be configured for use as either an A-side power source or a B-side power source.

Figure 7A:
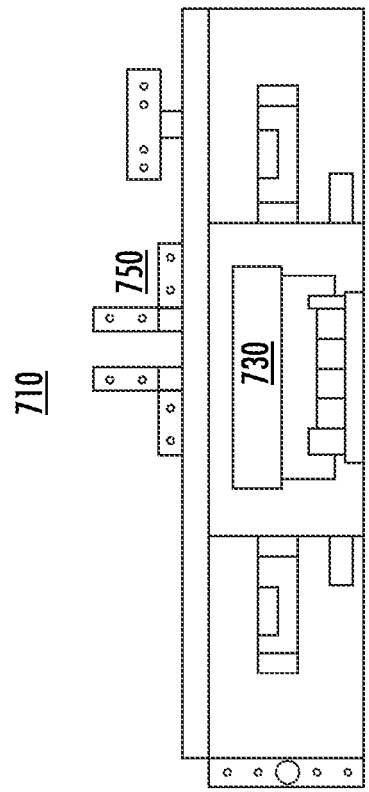
FIGS. 7A-7B depict respective bottom views of a power distribution and monitoring system according to example embodiments of the present disclosure.
Figure 7B:
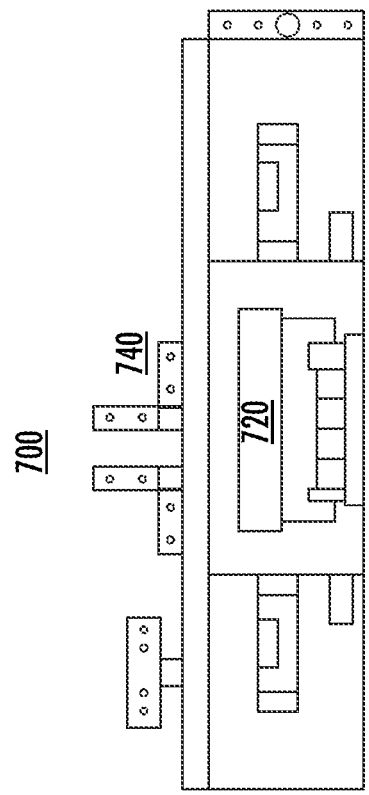

FIG. 7A depicts a bottom view 700 of a first power distribution and monitoring system 720 to be installed on a first side of a server rack according to example embodiments of the present disclosure. FIG. 7B depicts a bottom view 710 of a second power distribution and monitoring system 730 to be installed on a second side of a server rack according to example embodiments of the present disclosure. The first power distribution and monitoring system 720 can include anchoring brackets at a first position 740 that secure (e.g., fasten, install) the first power distribution and monitoring system 720 to a building structure (e.g., a wall, floor, ceiling, frame, etc.). Similarly, the second power distribution and monitoring system 730 can include anchoring brackets at a second position 750 to secure the second power distribution and monitoring system 730 to the building structure. By having the option to secure the anchoring brackets at either the first position or the second position, the power distribution and monitoring systems can be side agnostic during installation. Additional symmetry of the side panel of power distribution and monitoring system 720 and power distribution and monitoring system 730 is intended to facilitate power distribution and monitoring system design as being side agnostic so that a given power distribution and monitoring system can be configured for use as either an A-side power source or a B-side power source.

Figure 8B:
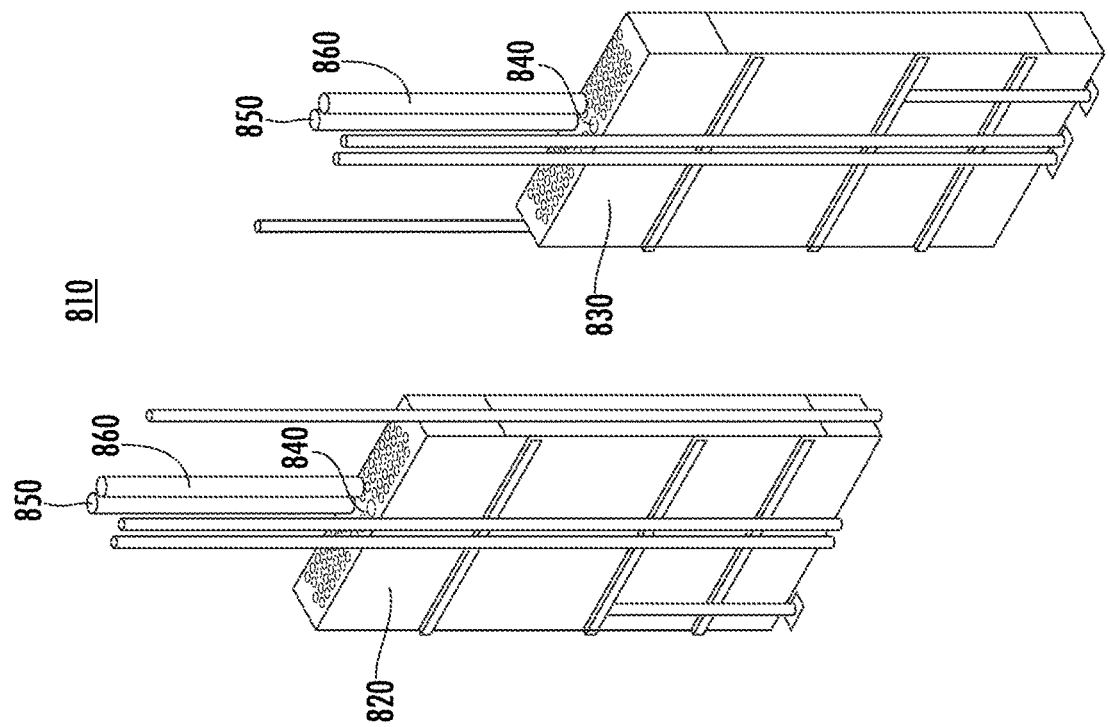
FIGS. 8A-8B depict respective perspective views of a power distribution and monitoring system according to example embodiments of the present disclosure.
Figure 8A:
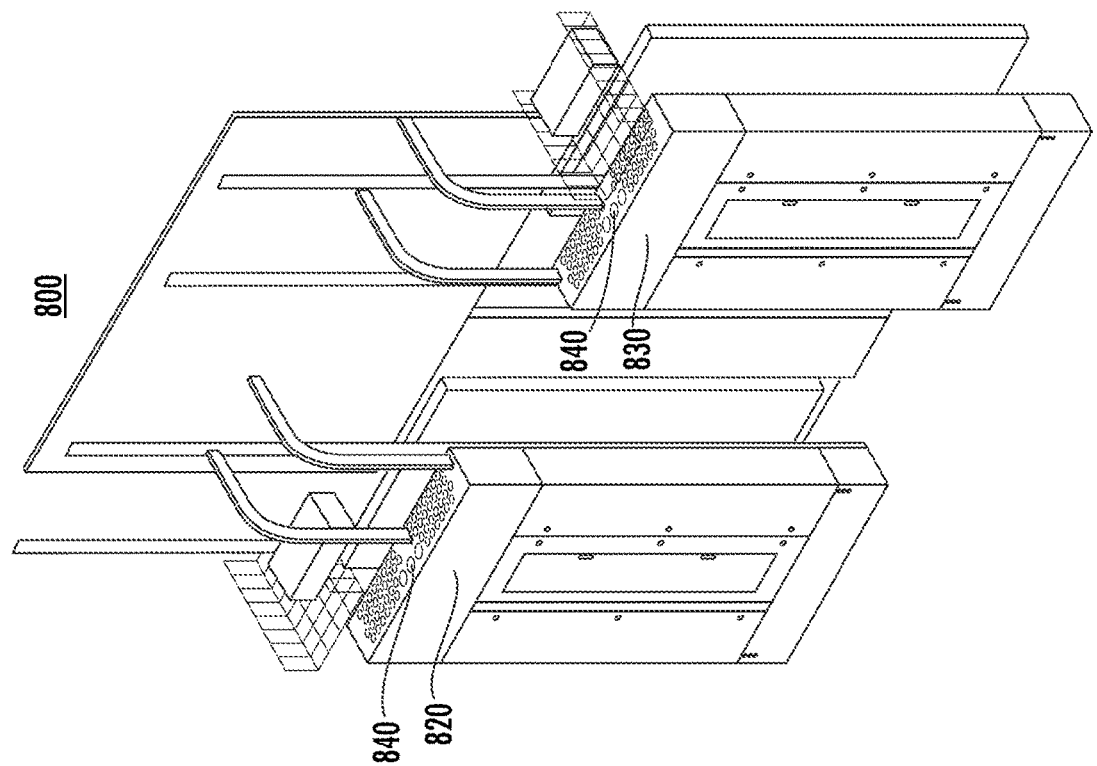

FIGS. 8A-8B depict respective perspective views 800, 810 of a first power distribution and monitoring system 820 and a second power distribution and monitoring system 830 according to example embodiments of the present disclosure. The first power distribution and monitoring system 820 can be installed on a first side of the server rack, and the second power distribution and monitoring system 830 can be installed on a second side of the server rack. As previously mentioned, the first power distribution and monitoring system 820 and the second power distribution and monitoring system 830 are side agnostic based on the design. The design can include the upper cable management compartment having three openings 840 for the conductors 850 and multiple openings 860 for the outgoing branch circuit conductors.

Figure 10:
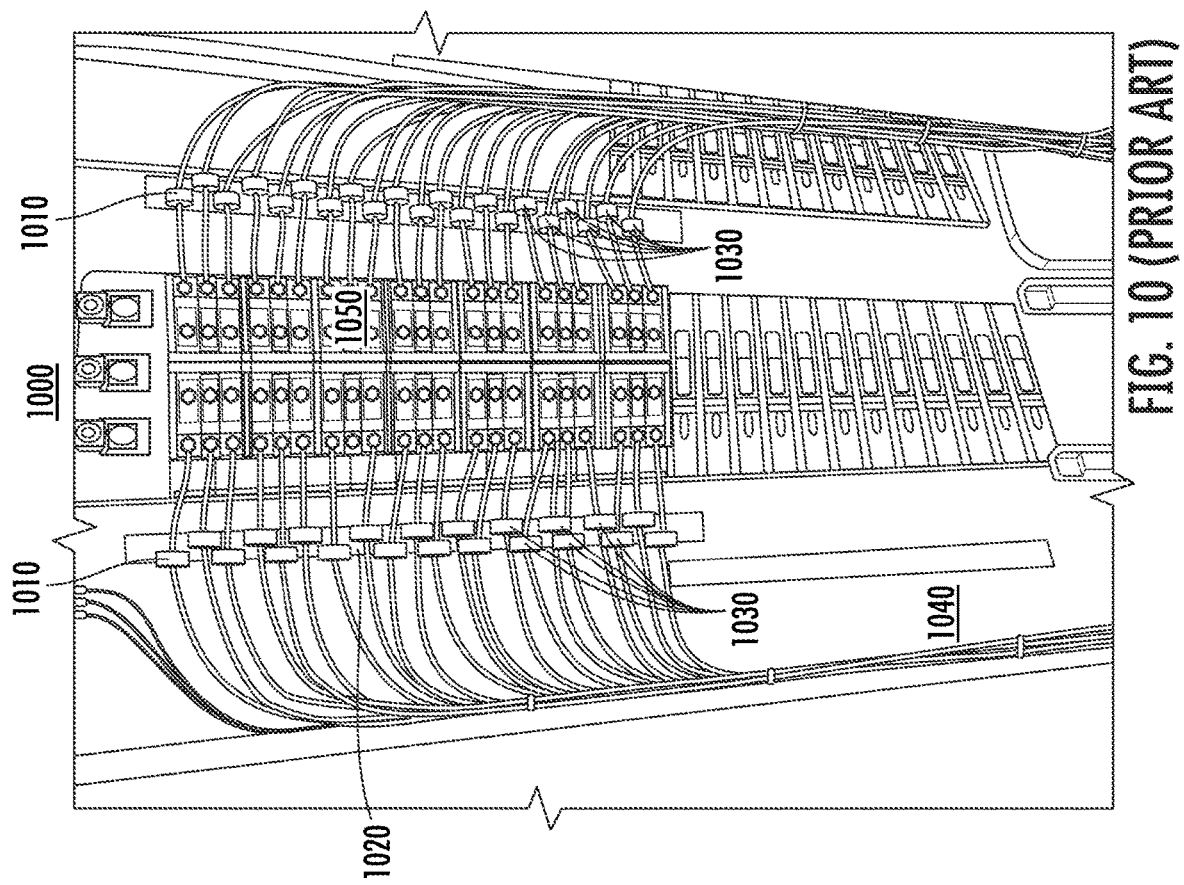
FIGS. 9 and 10 respectively depict portions of a power distribution and monitoring system with open enclosures according to example embodiments of the present disclosure.
Figure 9:
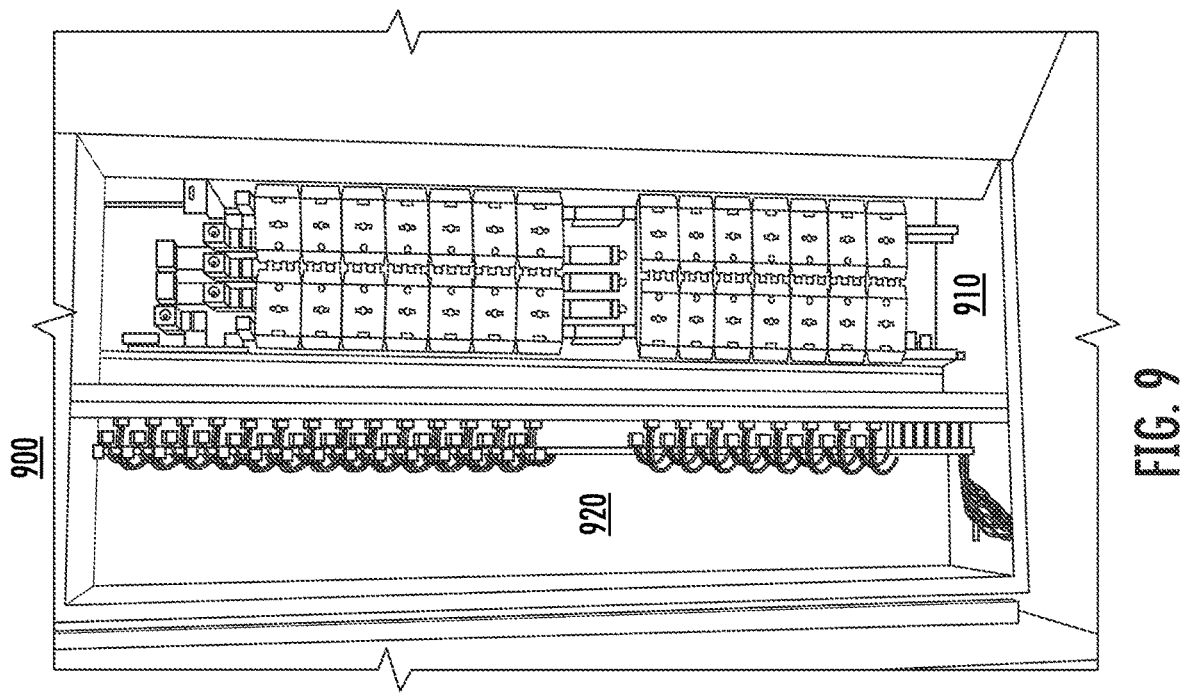

FIGS. 9 and 10 respectively depict portions of a power distribution and monitoring system with open enclosures according to example embodiments of the present disclosure. FIG. 9 illustrates a first enclosure 910 and a second enclosure 920 of a power distribution and monitoring system 900 that is designed using techniques described herein. The example arrangement in FIG. 9 allows an operator to access the CTs in the second enclosure 920 without getting close to the live bus bars and the energized compartment in the first enclosure 910. This example arrangement can position the CTs in the second enclosure 920 and the metering system (e.g., in another enclosure that is not pictured in FIG. 9) separate from the main power in the first enclosure 920. Therefore, all of the controls and metering components can be accessed individually, without necessarily reaching into a live compartment.

FIG. 10 illustrates a power distribution and monitoring system 1000 that is designed using conventional methods. As previously mentioned, the power distribution and monitoring system 1000 that is designed using conventional methods have many drawbacks. As illustrated in FIG. 10, the CTs 1030 and the circuit breaker 1050 are in the same enclosure 1040. For example, given that the power distribution and monitoring system 1000 only has one enclosure 1040, the first CT 1010 is in the same enclosure as the circuit breakers 1050 with the live bus and other energized electrical components, which can be unsafe for an operator that is trying to replace the first CT 1010. Additionally, when a first CT 1010 in a power distribution and monitoring system 1000 has to be replaced, the whole CT strip 1020 needs to be replaced with the remaining CTs 1030 that are soldered on the CT strip 1020.

Figure 11:
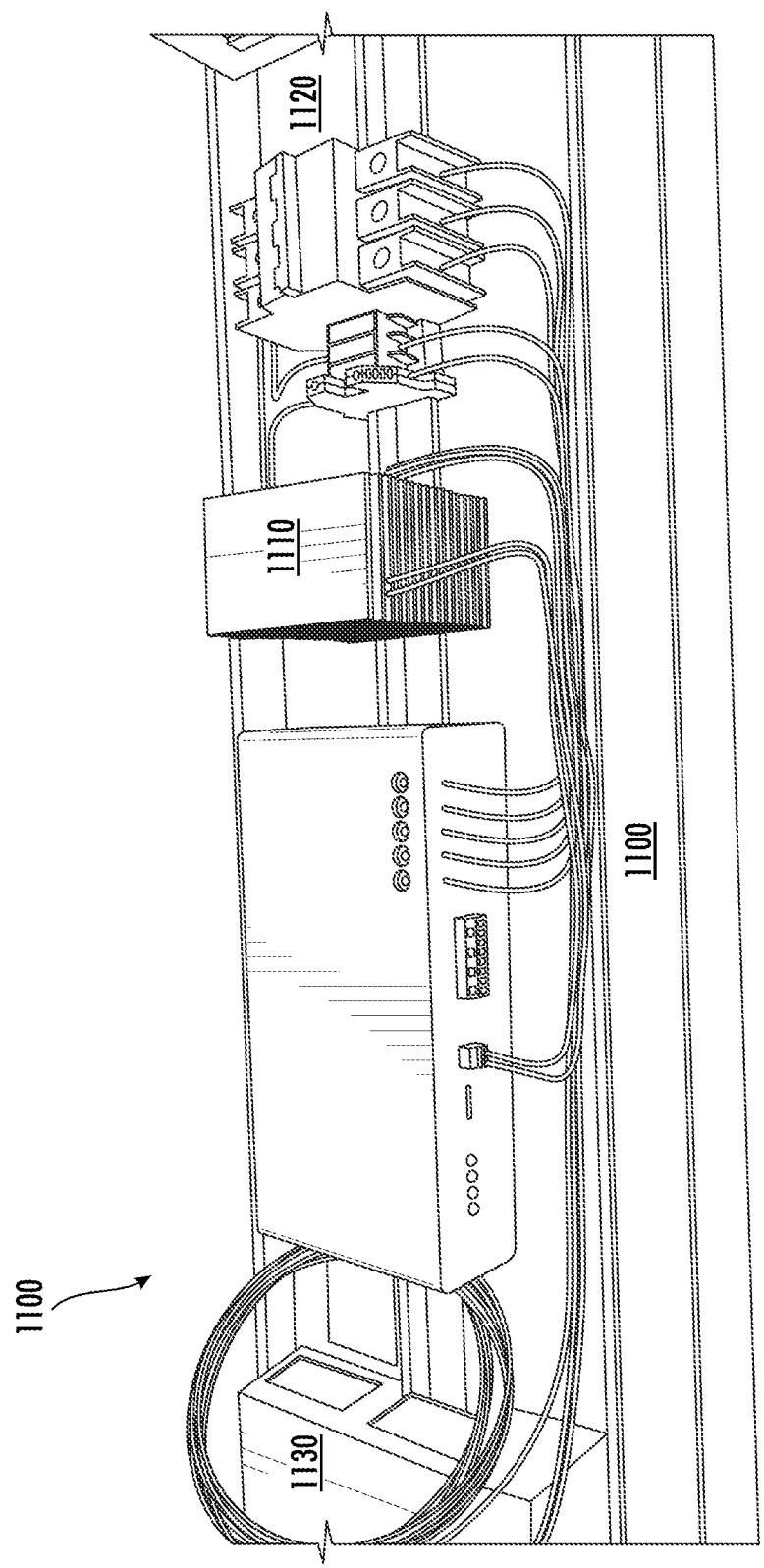
FIG. 11 depicts components of a metering device according to example embodiments of the present disclosure.

FIG. 11 depicts components of a metering device 1100 according to example embodiments of the present disclosure. The metering device 1100 includes a power supply 1110, and two wiring harnesses 1120, 1130 on either side of the metering device 1100 that enables the power distribution and monitoring system to be side agnostic.

Figure 12C:
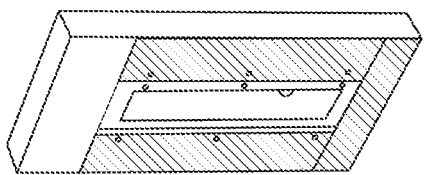
FIGS. 12A-12C depict respective views of a first power distribution and monitoring system for use as a first side of server rack according to example embodiments of the present disclosure.
Figure 13C:
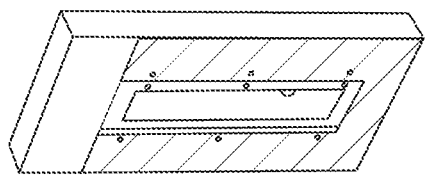
FIGS. 13A-13C depict respective views of a second power distribution and monitoring system for use as a second side of a server rack according to example embodiments of the present disclosure.
Figure 12B:
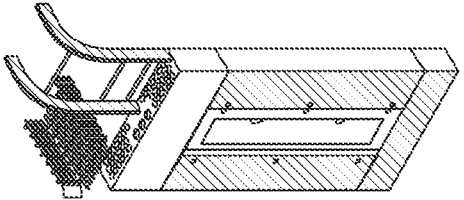
Figure 13B:
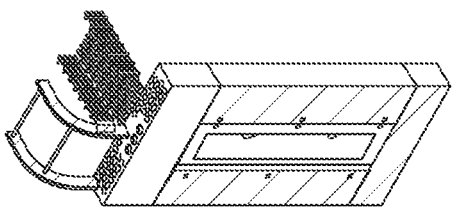
Figure 12A:
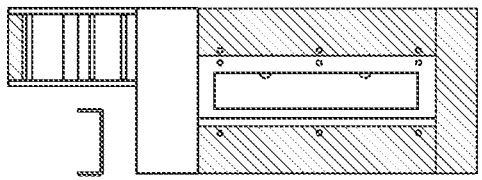
Figure 13A:
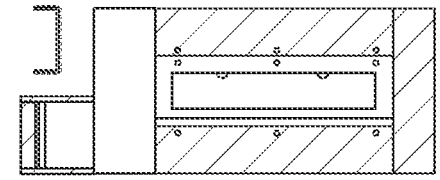

FIGS. 12A-12C depict respective views 1200, 1210, 1220 of a first power distribution and monitoring system for use as a first-side power source in a power distribution and monitoring system according to example embodiments of the present disclosure. FIGS. 13A-13C depict respective views 1300, 1310, 1320 of a second power distribution and monitoring system for use as a second-side power source in a power distribution and monitoring system according to example embodiments of the present disclosure. FIGS. 12A-13C describe some of the mechanical features of the power distribution and monitoring systems. For example, the position of a ladder 1240 and a basket 1250 for a left-side power distribution and monitoring system 1210 can be different from the position of a ladder 1340 and a basket 1350 of a right-sided power distribution and monitoring system 1310. Using the techniques described herein, the power distribution and monitoring system 1210, 1310 is side-agnostic, and thus can be installed on either side of the server rack. As illustrated in FIGS. 12A-13C, the openings at the top of the power distribution and monitoring system 1210, 1310 are symmetric, and therefore the ladder 1240, 1340 and the basket 1250, 1350 can be installed on either side of the power distribution and monitoring system. The ladder 1240, 1340 and the basket 1250, 1350 are designed to provide mechanical positioning and support for various electrical connectors coupled to the power distribution and monitoring systems.

In some instances, the ladder 1240, 1340 can physically support the circuit conductors that are coming out of the power distribution and monitoring system. For example, each circuit conductor can be connected to a circuit breaker inside the power distribution and monitoring system and a single server rack. The server rack can be part of the plurality of server racks located in a data center. The ladder can support the electric cables coming out of the power distribution and monitoring system to the other electric systems (e.g., server, server rack) in the data center. In some instances, the basket 1250, 1350 can include the fiber communication cables and network switches that are connected to each rack.

Aspects of the disclosure have been described in terms of illustrative embodiments thereof. Numerous other embodiments, modifications, and/or variations within the scope and spirit of the appended claims can occur to persons of ordinary skill in the art from a review of this disclosure. Any and all features in the following claims can be combined and/or rearranged in any way possible. Accordingly, the scope of the present disclosure is by way of example rather than by way of limitation, and the subject disclosure does not preclude inclusion of such modifications, variations or additions to the present subject matter as would be readily apparent to one of ordinary skill in the art. Moreover, terms are described herein using lists of example elements joined by conjunctions such as "and," "or," "but," etc. It should be understood that such conjunctions are provided for explanatory purposes only. Lists joined by a particular conjunction such as "or," for example, can refer to "at least one of" or "any combination of" example elements listed therein. Also, terms such as "based on" should be understood as "based at least in part on." As used throughout this application, the word "may" and "can" is used in a permissive sense (i.e., meaning having the potential to), rather than the mandatory sense (i.e., meaning must). Similarly, the words "include," "including," and "includes" mean including, but not limited to.

Those of ordinary skill in the art, using the disclosures provided herein, will understand that the elements of any of the claims discussed herein can be adapted, rearranged, expanded, omitted, combined, or modified in various ways without deviating from the scope of the present disclosure. Some implementations are described with a reference numeral for example illustrated purposes and is not meant to be limiting.

Although claims included herein may be shown to be dependent on other certain claims, any of the claims can depend on one or more other claims, including any preceding claims.

What is claimed is:

1. A system comprising:
a remote power panel (RPP) positioned adjacent to one or more racks, wherein the RPP comprises:
an upper cable management compartment having:
three openings for an incoming main power source, and an outgoing branch circuit conductor;
a circuit breaker mounted in a first enclosure;
a first set of phased current transformers (CTs) positioned in a first component arrangement of a second enclosure, the first set of phased CTs being coupled to the circuit breaker, and wherein the first set of phased CTs are configured to measure a current value flowing through the circuit breaker;
a first neutral current transformer (CT) positioned in a second component arrangement of the second enclosure, the first neutral CT being coupled to the circuit breaker; and
a metering device, wherein the metering device is configured to transmit data associated with the current value to a display system.

2. The system of claim 1, wherein the system is a low voltage electrical power distribution system operating at a maximum voltage of about 600 volts.

3. The system of claim 1, comprising a first remote power panel (RPP) and a second remote power panel (RPP) for each of the one or more racks, the first RPP positioned adjacent to a first end of a given rack, and the second RPP positioned adjacent to a second end of the given rack.

4. The system of claim 1, wherein the metering device is mounted in a third enclosure, and the third enclosure is located below the first enclosure and the second enclosure.

5. The system of claim 1, wherein the RPP further comprises:
a second set of phased current transformers (CTs) positioned in a first component arrangement of a fourth enclosure; and
a second neutral current transformer (CT) positioned in a second component arrangement of the fourth enclosure.

6. The system of claim 5, wherein the first enclosure is a compartment located between the second enclosure and the fourth enclosure, and wherein the first enclosure includes a main power distribution bus and a plurality of circuit breakers.

7. The system of claim 6, wherein the plurality of circuit breakers comprises a first set of circuit breakers that are coupled to a plurality of current transformers housed within the second enclosure and a second set of circuit breakers that are coupled to a plurality of current transformers housed within the fourth enclosure.

8. The system of claim 1, wherein the first set of phased CTs comprise solid-core CTs.

9. The system of claim 1, wherein the first set of phased CTs are individually mounted on an insulated support in a staggered arrangement and positioned laterally adjacent to the circuit breaker.

10. The system of claim 9, wherein the first neutral CT is mounted above the first set of phased CTs.

11. The system of claim 1, wherein the metering device converts an analog signal from the first set of CTs to digital data, and wherein the metering device stores the digital data.

12. The system of claim 1, wherein the metering device transmits, using an RJ-45 connector, the data associated with the current value to the display system, and wherein the display system is a remote device located outside the RPP.

13. The system of claim 1, wherein the RPP includes side-mounted terminal strips for ground conductors.

14. The system of claim 1; wherein the first enclosure and the second enclosure are independently accessible from a same surface of the RPP.

15. A system, comprising:
a rack;
a first remote power panel (RPP) positioned adjacent to a first end of the rack;
a second RPP positioned adjacent to a second end of the rack, wherein the first RPP and the second RPP respectively comprise:
a circuit breaker mounted in a first enclosure;
a first set of phased current transformers (CTs) positioned in a first component arrangement of a second enclosure, the first set of phased CTs being coupled to the circuit breaker, and wherein the first set of phased CTs are configured to measure a current value flowing through the circuit breaker;
a first neutral current transformer (CT) positioned in a second component arrangement of the second enclosure, the first neutral CT being coupled to the circuit breaker;
a second set of phased current transformers (CTs) positioned in a first component arrangement of another enclosure;
a second neutral current transformer (CT) positioned in a second component arrangement of the other enclosure; and
a metering device, wherein the metering device is configured to transmit data associated with the current value to a display system.

16. The system of claim 15, wherein the first enclosure is a compartment located between the second enclosure and the fourth other enclosure, and wherein the first enclosure includes a main power distribution bus and a plurality of circuit breakers.

17. The system of claim 16, wherein the plurality of circuit breakers comprises a first set of circuit breakers that are coupled to a plurality of current transformers housed within the second enclosure and a second set of circuit breakers that are coupled to a plurality of current transformers housed within the fourth other enclosure.

18. A system, comprising:
one or more racks;
one or more servers positioned relative to the one or more racks;
a remote power panel (RPP) coupled to the one or more racks, wherein the RPP comprises:
a first circuit breaker and a second circuit breaker mounted in a first enclosure;
a first set of phased current transformers (CTs) positioned in a first component arrangement of a second enclosure, the first set of phased CTs being coupled to the first circuit breaker, and wherein the first set of phased CTs are configured to measure a current value flowing through the first circuit breaker;
a first neutral current transformer (CT) positioned in a second component arrangement of the second enclosure, the first neutral CT being coupled to the circuit breaker;
a metering device mounted in a third enclosure, wherein the metering device is configured to transmit data associated with the current value to a display system; and a second set of phased current transformers (CTs) positioned in a first component arrangement of a fourth enclosure, the second set of phased CTs being coupled to the second circuit breaker; and
a second neutral current transformer (CT) positioned in a second component arrangement of the fourth enclosure.

* * * * *